United States Patent [19]  
Ishigaki et al.

[11] 3,976,951  
[45] Aug. 24, 1976

[54] GAIN CONTROL CIRCUITS UTILIZING A NOVEL SEMICONDUCTOR DEVICE

[75] Inventors: Yoshio Ishigaki, Tokyo; Takashi Okada, Yokohama, both of Japan

[73] Assignee: Sony Corporation, Tokyo, Japan

[22] Filed: Mar. 26, 1975

[21] Appl. No.: 562,348

[30] Foreign Application Priority Data

Apr. 4, 1974  Japan.............................. 49-38179

[52] U.S. Cl.............................. 330/29; 330/30 D; 357/34; 357/39
[51] Int. Cl.$^2$......................................... H03G 3/30
[58] Field of Search............... 330/29, 30 D, 38 M, 330/69, 145; 307/249, 250

[56] References Cited  
UNITED STATES PATENTS 3,710,270  1/1973  Addis et al............................ 330/29

Primary Examiner—James B. Mullins  
Attorney, Agent, or Firm—Hill, Gross, Simpson, Van Santen, Steadman, Chiara & Simpson

[57] ABSTRACT

A gain control circuit of the multistage differential amplifier type comprising a first pair of transistors forming a first differential amplifier supplied with an input signal, a second pair of transistors forming a second differential amplifier connected to amplify further the output of the first differential amplifier and a novel semiconductor device of the three-terminal type connected in common between the respective outputs of both the first pair of transistors and an operating voltage source, in which the gain control is attained by controlling the value of the current flowing through at least one differential amplifier. The novel semiconductor device has a semiconductive body similar to an ordinary transistor and acts as a bidirectionally conductive element with a superior symmetrical characteristic.

9 Claims, 3 Drawing Figures

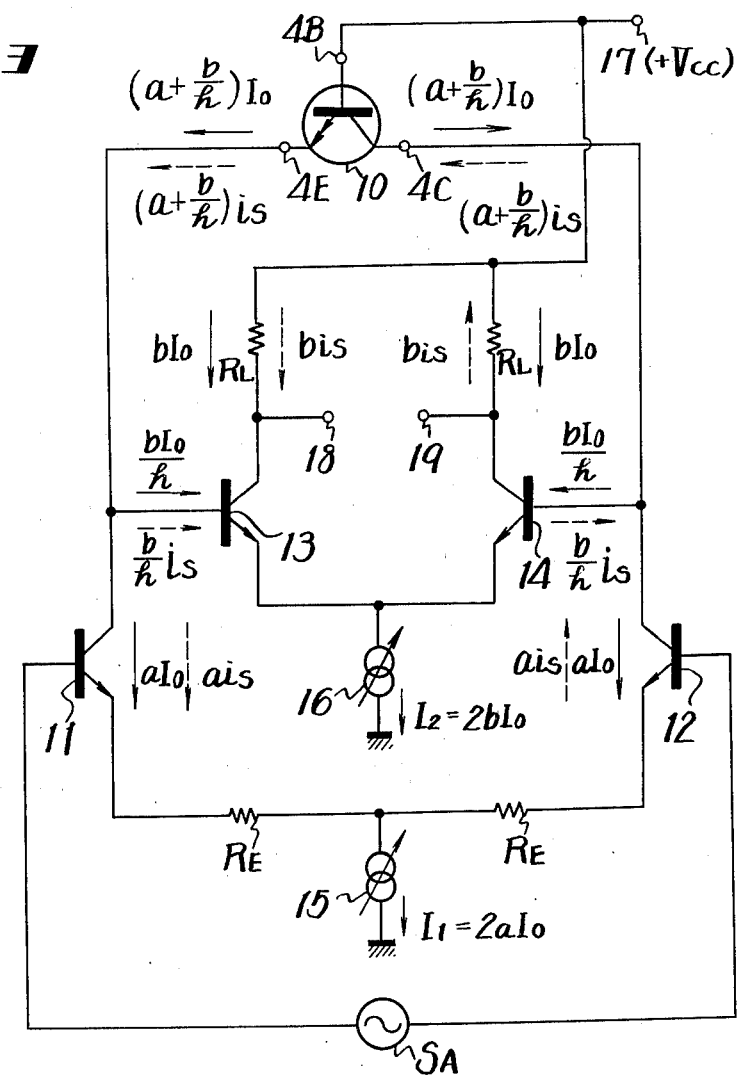

GAIN CONTROL CIRCUITS UTILIZING A NOVEL SEMICONDUCTOR DEVICE

BACKGROUND OF THE INVENTION

1. Field of the Invention

This invention relates generally to gain control circuits acting in general as amplifiers, and more particularly to gain control circuits of the differential amplifier type which have a pair of signal transmission paths operating differentially.

2. Description of the Prior Art

Gain control circuits of the differential amplifier type have been universally used for various kinds of electric apparatus, especially, in the form of an integrated circuit. In these gain control circuits, it is a basic structure that a differential amplifier which is formed by a pair of amplifying elements, such as transistors, and a current sink connected in common to the pair of amplifying elements is provided and the gain in amplification by the differential amplifier is controlled by means of changing the biasing condition of the amplifying element, changing the current value of the current sink or any other possible way. Generally, in practice, in order to achieve the gain control with increased efficiency and superior balance between both the amplifying elements, it has been proposed to provide a plurality of differential amplifiers in the form of the multistage type between an input terminal and an output terminal for signals to be gain controlled. For example, a differential amplifier of the first stage is provided to be supplied with an input signal and amplifying the same and an additional differential amplifier of the second stage is provided with a pair of input terminals connected to a pair of output terminals of the differential amplifier of the first stage, respectively, to further amplify the output of the differential amplifier of the first stage, and at least one of these differential amplifiers is gain controlled.

It is well known that in such a circuit of the multistage differential amplifier type as described above the gain control can be attained very effectively. The previously proposed gain control circuits, however, require a number of elements such as transistors and diodes for forming a gain controllable multistage differential amplifier and their circuit construction is relatively complicated. Furthermore, it is difficult for the previously proposed circuits to achieve a desirable balanced operation due to lack of uniformity in the characteristic of each element.

SUMMARY OF THE INVENTION

It is an object of the present invention to provide a gain control circuit of the multistage differential amplifier type which is provided with a decreased number of elements by means of utilization of a novel semiconductor device.

Another object of the present invention is to provide a gain control circuit having a novel and simplified circuit construction of the multistage differential amplifier type formed with a novel semiconductor device.

A further object of the present invention is to provide a gain control circuit of the multistage differential amplifier type having a superior balanced characteristic notwithstanding its simplified structure resulting from utilization of a novel semiconductor device which acts as a connecting element with symmetrically bidirectional conductivity.

This invention provides a gain control circuit which has fundamentally a first differential amplifier having a first current sink and supplied with an input signal, a second differential amplifier having a second current sink and connected to be supplied with the output of the first differential amplifier, and a novel semiconductor device of the three-terminal type connected to act as a load element to each of the first differential amplifiers, in which the gain control is attained by controlling the current value of at least one of the first and second current sinks. As a result of utilization of the novel semiconductor device, the circuit construction is simplified and well balanced operation is obtained. The novel semiconductor device comprises a three-terminal device with a semiconductor body similar to an ordinary transistor and able to perform the amplifying, gain controlling or switching operation like the ordinary transistor. One of the distinctive features of the novel semiconductor device resides in bidirectional conductivity of the superior symmetrical characteristic and this feature is mainly utilized in the gain control circuit according to the present invention.

Other objects, features and advantages of the present invention will become apparent from the following description taken in conjunction with accompanying drawings.

BRIEF DESCRIPTION OF THE DRAWINGS

FIG. 3 is a circuit diagram showing an embodiment of gain control circuits according to the invention.

DESCRIPTION OF THE PREFERRED EMBODIMENTS

Figure 1:
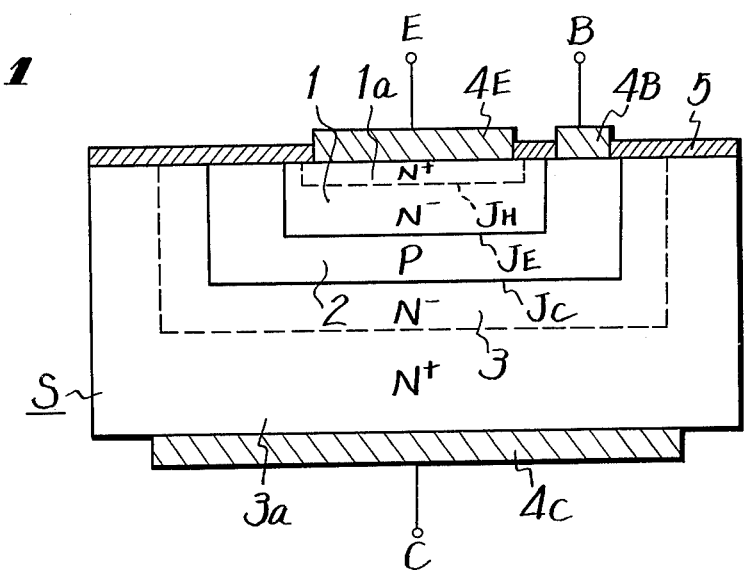
FIGS. 1 and 2 are cross-sectional views each showing an example of a semiconductor element which is useable in this invention.

Before describing the present invention, an embodiment of the novel semiconductor device useable in the invention will be now described.

The emitter-grounded current amplification factor $h_{FE}$ of a transistor, which is one of the parameters for evaluating the characteristics of the bipolar transistor, can be expressed by the following equation (1), if the base-grounded current amplification factor of the transistor is taken as $\alpha$.

$$h_{FE} = \frac{\alpha}{1-\alpha} \tag{1}$$

The factor $\alpha$ is expressed as follows:

$$\alpha = \alpha^* \beta \gamma \tag{2}$$

where $\alpha^*$ represents the collector amplification factor, $\beta$ the base transfer efficiency and $\gamma$ the emitter injection efficiency, respectively.

Now, if the emitter injection efficiency $\gamma$ of an NPN-type transistor is taken into consideration, $\gamma$ is given by the following expression (3).

$$\gamma = \frac{J_n}{J_n + J_p} = \frac{1}{1 + \frac{J_p}{J_n}} \tag{3}$$

where $J_n$ represents the current density of electrons injected from the emitter to the base of the transistor and $J_p$ the current density of holes injected from the base to the emitter of the transistor, respectively.

Since $J_n$ and $J_p$ are expressed by the following equations (4) and (5), respectively, $$J_n = \frac{qD_n n_n}{L_n} \left\{ \exp\left(\frac{qV}{kT}\right) - 1 \right\} \quad (4)$$

$$J_p = \frac{qD_p p_n}{L_p} \left\{ \exp\left(\frac{qV}{kT}\right) - 1 \right\} \quad (5)$$

the ratio $\delta$ of $J_n$ and $J_p$ is expressed as follows:

$$\delta = \frac{J_p}{J_n} = \frac{L_n}{L_p} \cdot \frac{D_p}{D_n} \cdot \frac{p_n}{n_p} \quad (6)$$

where $L_n$ represents the diffusion distance of the minority carriers in the base of the transistor; $L_p$ the diffusion distance of the minority carriers in the emitter of the transistor; $D_n$ the diffusion constant of the minority carriers in the base; $D_p$ the diffusion constant of the minority carriers in the emitter; $n_p$ the concentration of the minority carriers in the base under the equilibrium state; $p_n$ the concentration of the minority carriers in the emitter under the equilibrium state; $V$ a voltage applied to the emitter junction of the transistor; $k$ the Boltzmann's constant; and $T$ temperature.

If it is assumed that the impurity concentration in the emitter of the transistor is taken as $N_D$ and that in the base of the transistor taken as $N_A$, the term $p_n/n_p$ can be replaced by the term $N_A/N_D$. Further, since $L_n$ is restricted by the base width $W$ and $L_n = W$, the ratio $\delta$ is expressed as follows:

$$\delta = \frac{W}{L_p} \cdot \frac{D_p}{D_n} \cdot \frac{N_A}{N_D} \quad (7)$$

The diffusion constants $D_n$ and $D_p$ are functions of transfer of the carrier and temperature and in this case they are substantially constant.

As may be obvious from the above respective equations, in order to increase the current amplification factor $h_{FE}$ of a transistor, it is sufficient to make the ratio $\delta$ small.

Therefore, in an ordinary transistor, the impurity concentration $N_D$ of its emitter is selected high enough so as to make the ratio $\delta$ small.

However, if the impurity concentration of the emitter is selected sufficiently high, for example, more than $10^{19}$ atom/cm$^3$, lattice defects and dislocation occur in the crystal of the semiconductor body of the transistor to deteriorate the crystal. Further, due to the fact that the impurity concentration of the emitter itself is high, a life time $\tau_p$ of the minority carriers injected to the emitter from the base becomes short.

Since the diffusion distance $L_p$ is expressed by the following equation (8).

$$L_p = \sqrt{D_p \tau_p} \quad (8)$$

the diffusion distance $L_p$ of the minority carriers or holes becomes short. Therefore, as may be apparent from the equation (7), $\delta$ cannot be made very small and hence the injection efficiency $\gamma$ can not be made high over a certain value. As a result, the current amplification factor $h_{FE}$ cannot be made very high in the ordinary transistor.

As mentioned previously, the novel semiconductor device useable in this invention is free from the defects mentioned above inherent to the prior art transistor. The semiconductor device used in this invention may be constructed as an NPN-type or a PNP-type, one could be considered as in the case of the prior art transistor. An NPN-type semiconductor device useable in this invention will be now described with reference to FIGS. 1 and 2, by way of example.

As shown in FIG. 1, the NPN-type semiconductor device consists of a first semiconductor region 1 of N$^-$ type conductivity formed in a semiconductor substrate S of N$^+$ type conductivity, a second semiconductor region 2 of P type conductivity formed in the semiconductor substrate S adjacent the first region 1, and a third semiconductor region 3 of N$^-$ type conductivity formed in the substrate S adjacent the second region 2 to form a first PN-junction $J_E$ between the first and second regions 1 and 2 and a second PN-junction $J_c$ between the second and third regions 2 and 3, respectively.

With the semiconductor device useable in this invention and shown in FIG. 1, at the position facing the first junction $J_E$ and apart from it by a distance smaller than the diffusion distance $L_p$ of the minority carriers or holes injected from the second region 2 to the first region 1, a potential barrier having energy higher than that of the minority carriers or holes, or at least heat energy is formed in the first region 1. In the example of FIG. 1, the impurity concentration in the first region 1 is selected sufficiently low such as in the order of $10^{15}$ atoms/cm$^3$ and region 1a of N$^+$ type conductivity or an impurity concentration of about $10^{19}$ atoms/cm$^3$ is formed in the first region 1 to form an LH-Junction and hence to form the barrier.

The impurity concentration in the second region 2 is selected in the order of $10^{15}$–$10^{17}$atom/cm$^3$ and that in the third region 3 is selected sufficiently low such as in the order of $10^{15}$atom/cm$^3$.

In the semiconductor substrate S adjacent to the third region 3 but apart from the second junction $J_c$, there is formed a region 3a of N$^+$ type conductivity and with the impurity concentration of about $10^{19}$ atom/cm$^3$.

A first electrode 4E is formed on the high impurity concentration region 1a in the region 1 in ohmic contact therewith; a second electrode 4B is formed on the second region 2 in ohmic contact therewith; and a third electrode 4C on the high impurity concentration region 3a adjacent the third region 3 in ohmic contact therewith, respectively. From these electrodes 4E, 4B and 4C there are led out first, second and third terminals E, B and C, respectively. In FIG. 1, reference numeral 5 indicates an insulating layer made of, for example, SiO$_2$ and formed on the surface of the substrate S.

The semiconductor device shown in FIG. 1 can be used as a transistor. In such a case, the first region 1 serves as an emitter region; the second region 2 as a base region; and the third region 3 as a collector region, respectively. A forward bias is applied to the emitter junction $J_E$ and a reverse bias is applied to the collector junction $J_c$.

Thus, the holes injected from the base or the second region 2 to the emitter or first region 1 have a long life period of time due to the fact that the emitter region 1 has the low impurity concentration and good crystal property, and hence the diffusion distance $L_p$ of the holes in the emitter region 1 becomes long. As a result, as may be apparent from the equations (6) and (3), the emitter injection efficiency $\gamma$ can be made high. However, in the case that the diffusion distance $L_p$ is made long, if the injected holes into the emitter region 1 may arrive at the surface of the substrate S and may be recombined with electrons on the surface in practice, the diffusion distance $L_p$ could not be substantially lengthened. With the semiconductor device shown in FIG. 1, since the potential barrier is formed in the emitter region 1, which potential barrier faces the emitter junction $J_E$, at the position with a distance smaller than the diffusion distance $L_p$ of the minority carrier, the amount of the surface-recombination is reduced and the diffusion distance $L_p$ can be lengthened.

Due to the fact that the potential barrier is formed as described above in the example shown in FIG. 1, there is performed such an effect that the current density or component $J_p$ of the holes injected from the base region 2 to the emitter region 1 is reduced. That is, on the low concentration/high concentration (LH) junction $J_H$ in the emitter region 1, there is created a false Fermi level difference of built-in electric field which acts to suppress the diffusion of the holes or the minority carrier. Therefore, if the level of the Fermi level is sufficiently high, the diffusion currents caused by the concentration gradient of holes and the drift current caused by the built-in electric field are cancelled on the LH-junction the hole current $J_p$ injected from the base 2 through the emitter region 1 of low impurity concentration is reduced. By this effect, the ratio of electron current arriving at the collector region 3 relative to the current component passing through the emitter junction $J_E$ is increased and hence the emitter injection efficiency $\gamma$ is increased as apparent from the equation (3) to make the current amplification factor $h_{FE}$ high.

The above level difference (the height of the potential barrier) must be more than the energy of holes or at least the heat energy. The heat energy can be approximated as $kT$ but the above level difference is desired to be more than 0.1 eV. Within the transition region of the potential, the diffusion distance $L_p$ of the holes must not terminate within the transition region, or it is required that the diffusion distance $L_p$ of the hole must be greater than the width of the transition region.

In the case that LH-junction $J_H$ is formed as shown in FIG. 1, the potential barrier of 0.2 eV can be formed by suitably selecting the amount of impurity and gradient of the high impurity concentration region 1a.

Figure 2:
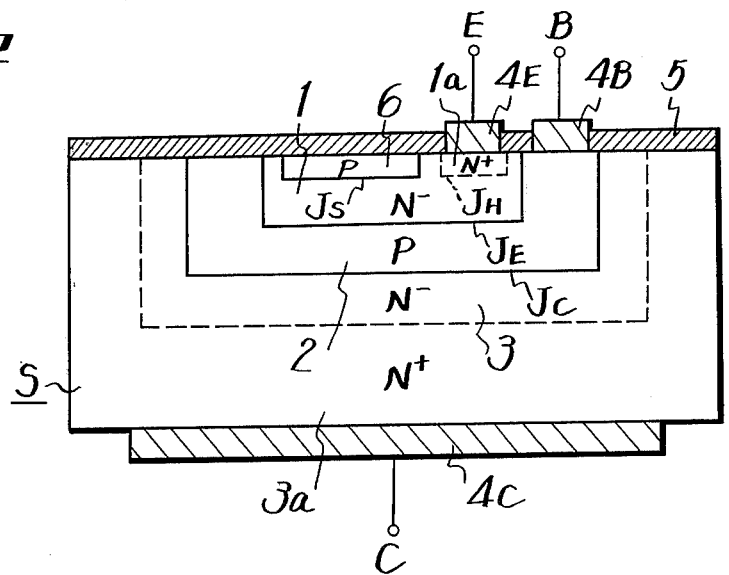

FIG. 2 shows another example of the semiconductor device useable with the invention in which reference numerals and letters same as those used in FIG. 1 indicate the same device so that their description will be omitted.

In the example of FIG. 2, in order to form a PN-junction $J_S$ facing the first or emitter junction $J_E$, an additional region 6 of P type conductivity is formed in the first region 1. In the example of FIG. 2, the distance between the junctions $J_S$ and $J_E$ is selected smaller than the diffusion distance $L_p$ of the minority carrier in the first region 1. The other construction of the example shown in FIG. 2 is substantially the same as that of the example shown in FIG. 1.

With the example of FIG. 2, since the diffusion distance $L_p$ of the hole injected to the first region 1 is long as described above, the hole arrives at the additional region 6 effectively and then is absorbed thereby. When the additional region 6 is floated from an electrical point of view, its potential is increased as the number of holes arriving at the additional region 6 is increased. Thus, the PN junction $J_S$ formed between the regions 6 and 1 is forward biased to its rising-up voltage, and then holes will be re-injected to the first region 1 from the additional region 6. Thus, the concentration of holes in the first region 1 near the additional region 6 will be increased, and accordingly the concentration distribution of holes between the junctions $J_E$ and $J_S$ in the first region 1 is made uniform and the gradient thereof becomes gradual to reduce the diffusion current $J_p$ from the second region 2 to the first region 1.

In the example of FIG. 2, the additional region 6 which has the same conductivity type as that of the second region 2 is formed in the first region 1 separated from the second region 2, but it may be possible that the second region 6 is formed as a continuous extension from the second region 2.

The above description relates to the operation of the first, second and third regions 1, 2 and 3 of the semiconductor devices as emitter, base and collector, respectively. However, in the above semiconductor device the impurity concentrations of the first and third regions 1 and 3 surrounding the second region 2 are selected low of about equal order and they are arranged symmetrically with respect to the second region 2, so that if the first, second and third region 1, 2 and 3 are used as, collector, base and emitter, respectively, the semiconductor devices can be operated as a transistor in reverse to the operating direction of those mentioned previously.

When the symmetry of the semiconductor devices is utilized, the symmetry can be emphasized by forming in the third region 3 a potential barrier facing the second junction $J_C$, surrounding the same and having the energy higher than that of the minority carrier or hole in the third region 3 as shown in FIG. 1 and 2 by dotted lines outside the junction $J_C$. To this end, the region 3a of high impurity concentration in the third region 3 is so formed to surround the junction $J_C$ and the distance between the junction $J_C$ and the region 3a is selected smaller than the diffusion distance of the minority carrier or hole injected to the third region 3 at the respective parts.

The features of the novel semiconductor devices described above can be summarized as follows which will be apparent from the above description.

1. The current amplification factor $h_{FE}$ is high and can be increased to 3000 or greater.

2. The current amplification factor $h_{FE}$ is uniform. That is, with a prior art transistor, the impurity concentration of the emitter region is selected sufficiently high so as to increase the emitter injection efficiency or the current amplification factor. Since the prior art transistor depends upon the difference of the impurity concentrations near the junction between the emitter and base regions, it is required to select the impurity concentrations in both the regions relative to one another. On the contrary, in the semiconductor devices for use with the invention, by forming the potential barrier in the emitter region 1 facing the emitter junction $J_E$, the current component of the minority carrier injected in the emitter region 1 is suppressed to increase the emitter injection efficiency. Therefore the mutual influence between the emitter and base regions 1 and 2 is small due to the fact that the emitter region 1 is selected relatively low in impurity concentration, and the width of the base region 2 and the distribution of impurity concentration therein can be selected as planned and hence $h_{FE}$ can be uniform as described above.

3. Since the effects of surface recombination is avoided, the current amplification factor $h_{FE}$ can be made high even if the current is low.

4. The noise can be reduced. That is, since the main parts of the first and second junctions $J_E$ and $J_C$ are formed between the low impurity concentration regions of P and N conductivity types, crystal defects are small. Further, if the impurity concentration near the electrode 4B attached to the second region 2, by way of example, is selected high, a component of the transistor emitter-base current along the surface of the semiconductor substrate S can be reduced. Therefore, the noise of $1/f$ can be reduced. Further, the burst noise and noise of $1/f$ can be also reduced since $h_{FE}$ is high. In addition, if a base expansion resistance $\gamma_{bb}'$ is made small, the noise can be reduced even if the impedance of a signal source is low.

5. The current amplification factor $h_{FE}$ has good temperature characteristics.

6. The semiconductor devices can be used as bidirectionally conductive transistors, respectively, and are excellent in symmetry.

7. Since the impurity concentration in the vicinity of the first and second junctions $J_E$ and $J_C$ is low, $BV_{BEO}$ (collector-opened base-emitter voltage) is high for both the forward and reverse directions of transistors.

8. When the semiconductor devices are used as a power transistor, their strength is high because their emission is made uniform by their distributed inner resistance in their emitter region.

9. Saturation characteristics are superior.

10. When the region 6 is formed for injection or re-injection, the equivalent resistance of the base is made low.

The invention has the basis on the fact that the above novel semiconductor device is symmetrical with respect to the second region 2, and provides a novel gain control circuit which is good in balance and small in number of elements used therein by employing the above novel semiconductor device.

An embodiment of the gain control circuit according to this invention will be hereinafter described with reference to FIG. 3. As shown in FIG. 3, in the invention a novel semiconductor device 10 shown in FIG. 1 or 2 and first to fourth transistors 11 to 14 are used. The first electrode 4E of the device 10 is connected to the collector of the first transistor 11 and to the base of the third transistor 13, while the third electrode 4C of the device 10 is connected to the collector of the second transistor 12 and to the base of the fourth transistor 14. A series connection of two resistors $R_E$ is connected between the emitters of the first and second transistors 11 and 12, and the connection point between the two resistors $R_E$ is connected with a first current sink 15. The emitters of the third and fourth transistors 13 and 14 are connected together to a second current sink 16. The collectors of the third and fourth transistors 13 and 14 are connected through load resistors $R_L$ to a voltage source 17 from which, for example, a positive voltage of $+V_{CC}$ is derived, and output terminals 18 and 19 are led out from the collectors of the third and fourth transistors 13 and 14, respectively. The second electrode 4B of the semiconductor device 10 is supplied with the voltage of $+V_{CC}$ from the voltage source 17. The bases of the first and second transistors 11 and 12 are differently supplied with an input signal $S_A$. In this case, the bases of the transistors 11 and 12 may be supplied with a predetermined bias, respectively, and at least one of the first and second current sinks 15 and 16 are variably controlled in their current value.

As described previously, the semiconductor device 10 has a symmetrical construction with respect to the second region 2 (refer to FIGS. 1 and 2), so that when the second electrode 4B is supplied with the constant bias voltage as shown in FIG. 3, a current can flow from the second electrode 4B to the first electrode 4E and also from the second electrode 4B to the third electrode 4C, respectively. In this case, if the voltages between the second and first electrodes 4B and 4E and between the second and third electrodes 4B and 4C are equal, the above two currents are made equal. Accordingly, in the case where the bases of the first and second transistors 11 and 12 are supplied with only the equal bias voltage as shown in FIG. 3, if the current value of the first constant current sink 15 is taken as $I_1 = 2aI_0$, a current of $aI_0$ may flow through the collectors of the transistors 11 and 12, respectively. If it is assumed that the current value of the second constant current sink 16 is taken as $I_2 = 2bI_0$ and the emitter-grounded current amplification factors of the third and fourth transistors 13 and 14 are taken as $h$, a current of $b/h\ I_0$ may flow through their bases, respectively, and a current of $(a + b/h)\ I_0$ may flow through the first and third electrodes 4E and 4C of the semiconductor device 10, respectively. Finally a current of $bI_0$ may flow through the collectors of the third and fourth transistors 13 and 14, respectively.

When the input signal $S_A$ is applied to the bases of the first and second transistors 11 and 12 differentially, a signal current of $a_{is}$ flows through the collectors thereof in opposite directions, respectively and a signal current of $b/h$ is also flows through the bases of the transistors 13 and 14 in opposite directions, respectively, as shown in FIG. 3. Further, a signal current of $(a + b/h)$ flows through the first and third electrodes 4E and 4C of the semiconductor device 10 in opposite directions relative to its second electrode 4B, and a signal current of $b_{is}$ flows through the collectors of the transistors 13 and 14 in opposite directions, respectively. Thus, at the output terminals 18 and 19, there are obtained output signals of reverse phases with each other.

The ratio of the signal current $a_{is}$, which flows through the collectors of the transistors 11 and 12, and the signal current $b_{is}$, which flows through the collectors of the transistors 13 and 14 or gain G of the circuit shown in FIG. 3 is expressed as follows:

$$G = \frac{b}{a} = \frac{I_2}{I_1} \qquad (9)$$

Accordingly, it may be apparent that by varying the current value $I_1$ or $I_2$, the gain G of this circuit can be controlled.

With the circuit of FIG. 3, if an output signal level is intended to be varied when an input signal level is constant such as in the case of volume control, it is sufficient to vary the current value $I_2$ of the second constant current sink 16, while if an output signal level is intended to be made constant when an input signal level is varied as in the case of an automatic gain control circuit, it is sufficient to vary the current value $I_1$ of the first constant current sink 15 with a gain control signal or the like. In some cases, it may be possible that the current values $I_1$ and $I_2$ of both the constant current sinks 15 and 16 are varied in opposite directions with each other.

In the novel semiconductor device shown in FIGS. 1 and 2, it may be possible that the regions 1, 1a, 2, 3, 3a and 6 are formed to have different conductivity types from those of the regions shown in the figures to form a PNP-type semiconductor element with the same effect.

Accordingly, when a PNP-type semiconductor element mentioned just above is employed as the semiconductor device 10 of this invention, it may be desired that as the first to fourth transistors 11 to 14, PNP-type transistors are used.

Since the above novel semiconductor device acts as a transistor, this semiconductor device may be used as the first to fourth transistors 11 to 14 of this invention.

Further, a field effect transistor may be used as the first to fourth transistors 11 to 14 of this invention.

It may be also possible that the collector of any one of the third and fourth transistors 13 and 14 is connected with the load resistor only and an output terminal is led out from this collector.

According to this invention, a gain control circuit of the differential amplifier type good in balance can be proposed by using the novel semiconductor device. Further, the gain control circuit of this invention can be formed of few elements and hence it can easily be formed as an integrated circuit.

I claim as my invention:

1. A gain control circuit comprising;
  a. a first differential amplifier stage having first and second amplifying devices and a first current sink connected in common to both the first and second amplifying devices,
  b. a second differential amplifier stage having third and fourth amplifying devices, input terminals of said third and fourth amplifying devices being connected to output terminals of said first and second amplifying devices, respectively, and a second current sink connected in common to both the third and fourth amplifying devices,
  c. signal input means connected to at least one of the input terminals of said first and second amplifying devices,
  d. signal output means connected to at least one of the output terminals of said third and fourth amplifying devices, and
  e. a semiconductor device comprising a first semiconductor region of one type, a second semiconductor region of the other type adjacent said first region with a first semiconductor junction therebetween, a third semiconductor region of the same type as said first region adjacent said second region with a second semiconductor junction therebetween, said first region being provided therein with a potential barrier having energy higher than that of minority carriers injected from the second region to the first region at the position facing said first junction and apart from the same by a distance smaller than the diffusion distance of the minority carriers, and first, second and third terminals led from said first, second and third regions, respectively, said first and third terminals being connected to the output terminals of said first and second amplifying devices, respectively, and said second terminal being connected to an operating voltage source.

2. A gain control circuit according to claim 1, wherein at least one of said first and second current sinks is formed into a variable current sink operable to control the value of a current flowing therethrough.

3. A gain control circuit according to claim 2, wherein said signal output means comprises a load impedance connected between at least one of the output terminals of said third and fourth amplifying devices and the operating voltage source.

4. A gain control circuit according to claim 3, wherein all of said amplifying devices are transistors of the same conductivity type.

5. A gain control circuit according to claim 3, wherein all of said amplifying devices are said semiconductor devices.

6. A gain control circuit according to claim 1, wherein said first and third regions of the semiconductor device have the impurity concentration in substantially the same order and said first region is provided therein a portion having the impurity concentration higher than other portions of the first region at the position apart from said first junction by a distance smaller than the diffusion distance of the minority carriers to make said potential barrier.

7. A gain control circuit according to claim 1, wherein said first and third regions of the semiconductor device have the impurity concentration in substantially the same order and an additional semiconductor region of the same type as said second region is provided in said first region at the position apart from said first junction by a distance smaller than the diffusion distance of the minority carriers to make said potential barrier.

8. A gain control circuit comprising:
  a. a first differential amplifier stage having first and second amplifying devices and a first current sink connected in common to both the first and second amplifying devices;
  b. a second differential amplifier stage having third and fourth amplifying devices, input terminals of said third and fourth amplifying devices being connected to output terminals of said first and second amplifying devices, respectively, and a second current sink connected in common to both the third and fourth amplifying devices;
  c. signal input means connected to at least one of the input terminals of said first and second amplifying devices;
  d. signal output means connected to at least one of the output terminals of said third and fourth amplifying devices;
  e. a semiconductor device comprising a first semiconductor region of one conductivity type having a predetermined impurity concentration, a second semiconductor region of the other conductivity type having a predetermined impurity concentration interfaced with said first region and forming a first semiconductor P-N junction with said first region, a third semiconductor region of the same conductivity type as said first region having a predetermined impurity concentration interfaced with said second region at a point spaced from said first junction and forming a second P-N semiconductor junction with said second region, a fourth semiconductor region of the same conductivity type as said first region interfaced with said first region, having a predetermined impurity concentration substantially higher than that of said first region and spaced from said first P-N junction by a distance smaller than the diffusion length of minority carriers injected into said first region from said second region when said first P-N junction is forwardly biased, said first and fourth regions forming a first L-H semiconductor junction at their interface, a fifth semiconductor region of the same conductivity type as said third region interfaced with said third region, having a predetermined impurity concentration substantially higher than that of said third region and spaced from said second P-N junction by a distance smaller than the diffusion length of minority carriers injected into said third region from said second region when said second P-N junction is forwardly biased, said third and fifth regions forming a second L-H junction at their interface, the difference in impurity concentrations on opposite sides of each of said first and second L-H semiconductor junctions being selected to provide an energy barrier higher than the energy level of said injected minority carriers reaching said L-H junctions from said second region; and f. first, second and third terminals led from said first, second and third regions respectively, said first and third terminals being connected to output terminals of said first and second amplifying devices, respectively, and said second terminal being connected to an operating voltage source.

9. A gain control circuit comprising:

a. a first differential amplifier stage having first and second amplifying devices and a first current sink connected in common to both the first and second amplifying devices;

b. a second differential amplifier stage having third and fourth amplifying devices, input terminals of said third and fourth amplifying devices being connected to output terminals of said first and second amplifying devices, respectively, and a second current sink connected in common to both the third and fourth amplifying devices;

c. signal input means connected to at least one of the input terminals of said first and second amplifying devices;

d. signal output means connected to at least one of the output terminals of said third and fourth amplifying devices; and e. a bidirectional bipolar junction type semiconductor device having first, second and third terminals, said first and third terminals being connected to output terminals of said first and second amplifying devices, respectively, and said second terminal being connected to a substantially constant operating voltage source.

* * * * *